United States Patent [19]  
Tanaka

[11] 3,974,466  
[45] Aug. 10, 1976

[54] ELECTROCHEMICAL REED FILTER
[75] Inventor: Toshiharu Tanaka, Kadoma, Japan
[73] Assignee: Matsushita Electric Industrial Co., Ltd., Japan
[22] Filed: July 17, 1974
[21] Appl. No.: 489,102

[30] Foreign Application Priority Data
July 20, 1973 Japan.......................... 48-85093[U]

[52] U.S. Cl................................ 333/72; 310/8.2; 310/9.4; 310/25; 333/71
[51] Int. Cl.²...................... H03H 9/06; H03H 9/26; H01L 41/10
[58] Field of Search........... 333/71, 72, 30 R, 30 M; 310/25, 26, 8–9.8; 58/23 TF; 84/409; 331/154–157

[56] References Cited
UNITED STATES PATENTS

| | | | |
|---|---|---|---|
| 3,354,413 | 11/1967 | Ko ....................................... | 333/72 |
| 3,503,009 | 3/1970 | Horstmann et al. ............. | 331/156 X |
| 3,621,467 | 11/1971 | Dostal............................ | 58/23 TF X |
| 3,795,831 | 3/1974 | Fujita................................. | 310/9.4 |

Primary Examiner—Alfred E. Smith  
Assistant Examiner—Marvin Nussbaum  
Attorney, Agent, or Firm—Robert E. Burns; Emmanuel J. Lobato; Bruce L. Adams

[57] ABSTRACT

An electromechanical reed filter has a pair of reed elements secured at one end to each other and supported on a base member. A electromechanical transducer is cemented to the side surface of each of the reed elements intermediate of the opposite ends of the reed. The reed filter is housed in a protective casing and is provided with a shock-absorbing member in the vicinity of the free ends of the reed elements. When an abnormal shock is applied to the filter the reed elements are caused to bend transversely and would strike the inner walls of the casing with the shock-absorbing member being interposed therebetween. The impact energy is effectively absorbed so that the cemented portion of the transducer is protected from deformation or cracks. The shock-absorbing member may be applied to the free ends of the reed elements so that spurious vibrations at frequencies higher than the fundamental frequency can be suppressed.

5 Claims, 11 Drawing Figures

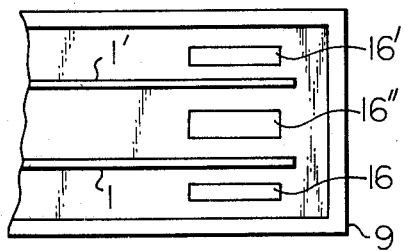
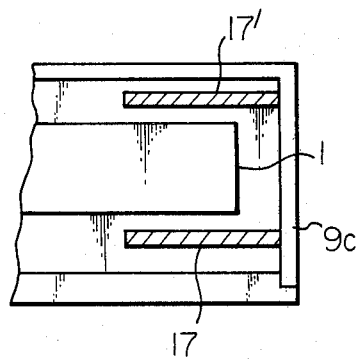
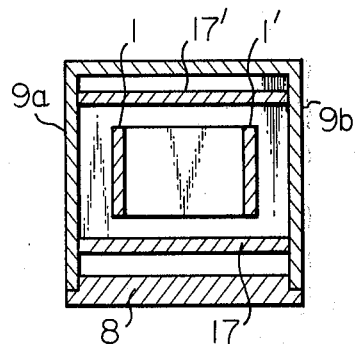

ELECTROCHEMICAL REED FILTER

The present invention relates to frequency sensitive electromechanical systems, and particularly to electromechanical reed filters employing a vibratory reed as the frequency filtering element, and more particularly to means for ensuring stability against external shock.

It is well known that a tuning fork which consists of a pair of metal, vibratory reeds extending from the end of a stem, when struck, emits a tone of fixed pitch. Because of their simple mechanical structure, purity of tone, and constant frequency, tuning forks are widely used as standards of frequency in music acoustics. Because of their constant frequency which is primarily determined by the length and the thickness of the reed elements, tuning forks are also used as a filtering element in an arrangement known as an electromechanical reed filter. In such an arrangement, the tuning fork is provided with a pair of electromechanical transducers such as piezoelectric elements, one for causing vibrations by an exciting input signal and the other for converting the vibration at the natural frequency of the tuning fork into an electric signal. The tuning fork, when excited by the input signal, is caused to vibrate at its natural or fundamental frequency, and thus only that signal having a frequency which is equal to the fundamental frequency is obtained at the output. In the filter arrangement, the piezoelectric elements are usually cemented or bonded with an adhesive to the side surface of the respective reed elements and coupled to input and output circuits.

However, the size of the reed elements is intimately associated with the frequency desired and thus relatively large compared with other electronic device components. Therefore, the tendency is toward reducing the size of the casing in which the reed elements are housed, so that only a very slight clearance will be allowed between the inner walls of the casing and the reed elements of the tuning fork. Under such circumstances, violent transverse vibrations of the free ends of the reeds, such as happens when the filter casing receives an abnormal external shock, would cause a flexure of said reed elements to a considerable degree and the free ends of the reeds would violently strike the inner walls of the casing. For this reason, a permanent deformation or cracks are likely to occur in the adhesive securing the piezoelectric element to the reed element and the contact therebetween is severely impaired. Further, when the reed elements are excited by an input signal, spurious vibration inherently occurs. Such spurious vibration is higher-order harmonics and thus the output signal would contain objectionable frequency components which must be electrically eliminated in the associated output circuit.

Therefore, an object of the invention is to provide a reed filter employing a pair of reeds as a frequency filtering element which is assured of stability from an abnormal external shock.

Another object of the invention is to effectively absorb violent vibrations occurring at the free ends of the reed elements caused by external shock so that the adhesive securing the piezoelectric element to the reed element is protected from deformation and cracks.

A further object of the invention is to suppress the inherent higher-order harmonics.

A still further object of the invention is to minimize the size of the protective casing in which the reed filter is housed.

In accordance with the present invention, there is provided a frequency sensitive electromechanical filter which comprises a base member, a protective casing on said base member, a pair of elongated mechanical resonant reed elements, one end region of respective ones of said reed elements being secured to each other and to said base member, electromechanical transducers each being adhesively secured to the side surface of said reed element, means for making electrical contact with said electromechanical transducers, and shock-absorbing means disposed in the vicinity of the other end regions of said reed elements.

The invention will further be described with reference the accompanying drawings, in which:

FIG. 6 is a fragmentary plan view of the filter with a plurality of blocks of resilient members juxtaposed in spaced relation to the reed elements.

Figure 1:
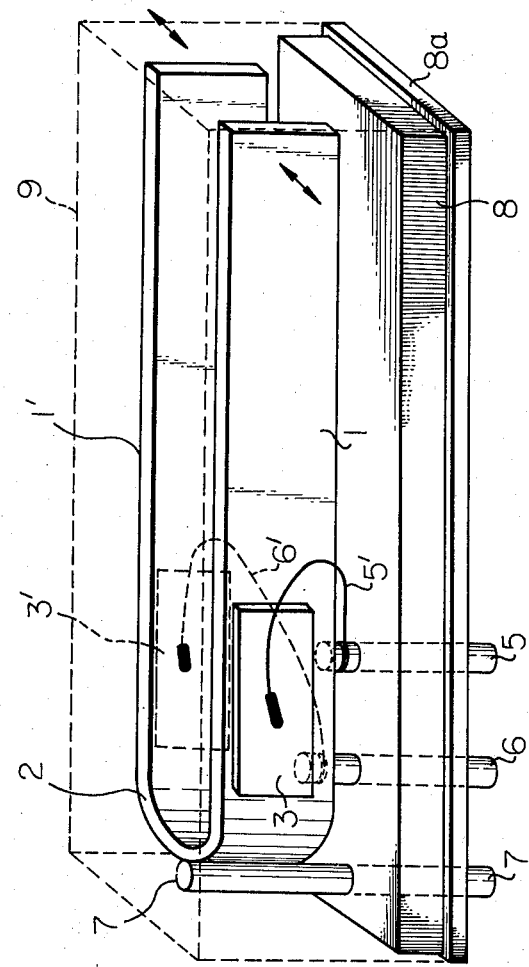
FIG. 1 is a perspective view of a conventional frequency sensitive electromechanical filter employing a pair of vibratory reeds housed in a casing.

Referring now to FIG. 1, there is shown a conventional electromechanical filter with which the invention is concerned and which comprises a tuning fork having a pair of elongated mechanically resonant metal reeds 1 and 1' which parallely extend from a stem portion 2 securely fixed to a metal support 7. The support 7 is in turn securely fixed to and extends through a base member 8 of an insulating material to serve as a terminal for providing connection to ground. The reed elements 1 and 1' are held at a distance from the upper surface of the base member 8 with the free ends thereof being arranged to vibrate transversely as shown by the arrows when an exciting signal is applied thereto. Piezoelectric transducers 3 and 3' are cemented or bonded to the sides of the reed elements 1 and 1' preferably adjacent the stem portion 2 by means of a suitable adhesive which assures complete surface-to-surface cementation therebetween so that the reed elements are effectively caused to vibrate by the exciting signal and the vibration thereof at the natural frequency of the reed elements are effectively converted into an output electric signal. Electrical connections are made to the transducers 3 and 3' and to the respective terminals 5 and 6 which extend through the base member 8 and is securely fixed thereto. The terminal 5 serves as an input terminal and the terminal 6 as an output terminal. The base member 8 has a flanged portion 8a on the outer periphery thereof on which a metal or plastic casing or cover 9 is disposed as shown in dashed line.

Figure 2A:
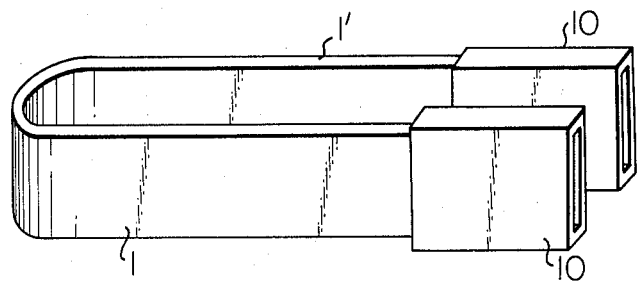
FIGS. 2a to 2c illustrate shock-absorbing members secured to the free ends of the reeds.
Figure 2B:
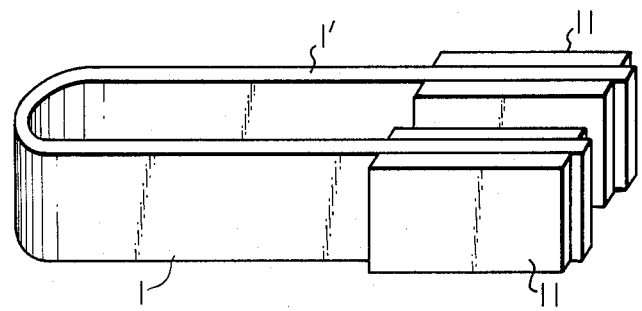
Figure 2C:
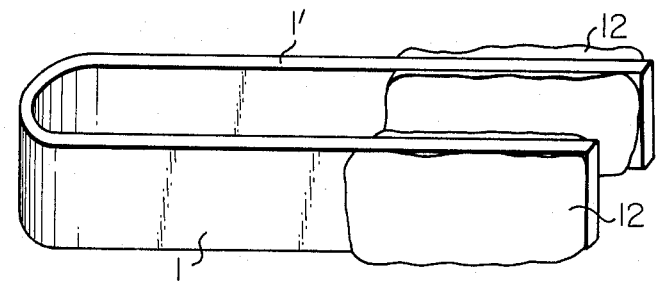

In accordance with the present invention, each of the reed elements 1 and 1' is provided with a shock-absorbing member of a resilient material at the free end thereof. In FIG. 2a, the shock absorbing member 10 has a predetermined weight and is formed of rubber in cylindrical form which is fitted to the free ends of the reed elements. This however adds to the total weight of the tuning fork and tends to slightly vary the fundamental frequency of the tuning fork. Therefore, consideration should be given to compensate for the added weight to determine the fundamental frequency of the vibrator reeds. The increased weight at the free ends of the reed elements causes variation in the distribution of weight throughout the length of the reed element so that spurious vibration at a higher frequency than the natural frequency of the reeds when excited by an input signal will be minimized. Another example is shown in FIG. 2b wherein each of the reed elements is provided with a piece of rubber 1 on the outer or opposite sides thereof by means of a suitable adhesive. Another alternative is to attach a layer 12 of a resilient adhesive such as silicon rubber to the outer or opposite sides of each of the reed elements (FIG. 2c). The outer surface of the resilient adhesive would dry and become non-adhesive, however, the material inwardly from the outer surface would keep its resilient properties. The resilient adhesive can also serve as a shock absorbing material.

The provision of a shock absorbing member of a predetermined weight at the free ends of the reed elements provides the dual functions of preventing the reeds from vibrating at a frequency other than the fundamental frequency thereof when excited by the input signal and of preventing deformation or cracks from occurring in the adhesive securing the electromechanical transducers to the reed elements.

It is seen from the above that when an abnormal external shock is applied to the electromechanical filter, the reed elements are caused to bend transversely and violently strike the inner walls of the casing. The impact energy is materially absorbed by the resilient members and thus no permanent deformation or cracks would occur in the adhesive which cements the piezoelectric elements to the side surfaces of the reed elements.

Figure 3:
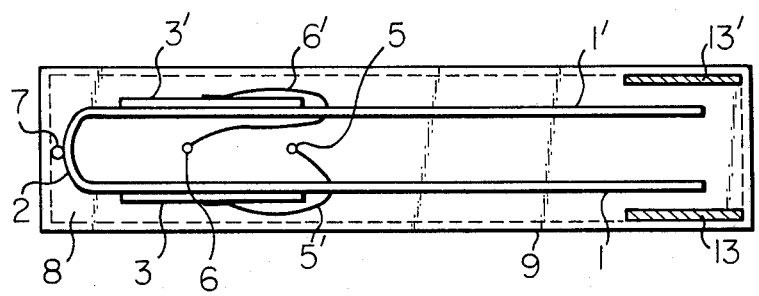
FIG. 3 is a plan view of the electromechanical filter with a casing provided with the shock-absorbing members on the inner side walls thereof.
Figure 4:
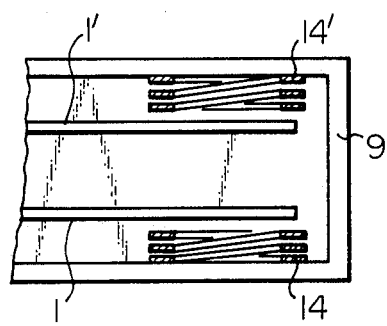
FIG. 4 is a fragmentary plan view of the electromechanical filter with a pair of coil springs attached to the inner side walls of the casing as the shock-absorbing member.
Figure 5A:
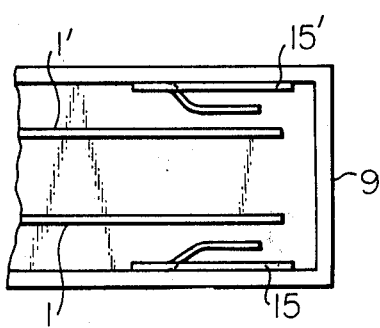
FIG. 5a is fragmentary plan view of the filter with a pair of leaf springs attached to the inner side walls of the casing as the shock-absorbing member.
Figure 5B:
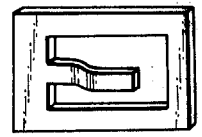

Another embodiment of the invention is shown in FIG. 3 wherein the construction is similar to that shown in FIG. 1 except at the ends of the reed elements 1 and 1'. The casing 9 has its inner side walls adjacent to the free ends of the reed elements partly covered with a piece of resilient material 13 and 13' such as silicon rubber or a resilient member such as coiled springs or spiral springs 14 and 14' (FIG. 4) or leaf springs 15 and 15' (FIGS. 5a and 5b). It is important that these resilient members be spaced from the outer side surfaces of the reeds 1 and 1' so that the free ends thereof are free from contact with the resilient members when the reeds are caused to vibrate under normal excitation.

Another alternative approach is shown in FIG. 6 in which a plurality of blocks of resilient material 16, 16' and 16'' such as rubber are juxtaposed on the base member 8 in parallel relation to each other and suitably spaced from the reed elements 1 and 1' and from the inner surfaces of the casing 9. The upper ends of the resilient blocks are thus free to move transversely. With this arrangement, the blocks are caused to bend upon contact with the reeds under abnormal shock so that the shock absorbing effect of the resilient material is enhanced by the bending thereof as well as the resilient properties thereof. It may be appreciated that the resilient blocks are cemented to the base member 8 or to the upper wall of the casing so that the resilient blocks are suspended therefrom.

FIGS. 7a and 7b illustrate another example wherein shock-absorbing members 17 and 17' are secured to the side walls 9a and 9b and to the end wall 9c of the casing 9 so that vibrations occurring at the free ends of the reed elements 1 and 1' in directions perpendicular to the normal transverse vibrations due to abnormal shock can be absorbed.

The foregoing description shows only preferred embodiments of the present invention. Various modifications are apparent to those skilled in the art without departing from the scope of the present invention which is only limited by the appended claims. Therefore, the embodiments shown and described are only illustrative, not restrictive.

What is claimed is:

1. A frequency sensitive electromechanical filter comprising, a base member, a protective casing mounted on said base member, a pair of elongated resonant reed elements with one end region of each of said reed elements being connected together and connected to said base member, an electromechanical transducer secured by adhesive to the side surface of each said reed element, means for making electrical contact with said electromechanical transducers, and shock-absorbing means including a spring secured to the inner walls of said protective casing in the vicinity of the other end region of each said reed element for preventing cracking of said adhesive and/or said electromechanical transducers due to external shocks being imparted to the filter.

2. A frequency sensitive electromechanical filter comprising, a base member, a protective casing mounted on said base member, a pair of elongated resonant reed elements made of metal with one end region of each of said reed elements being connected together and connected to said base member, an electromechanical transducer secured by adhesive to the side surface of each said reed element, means for making electrical contact with said electromechanical transducers, and shock-absorbing means secured to said other end region of each said reed element for preventing cracking of said adhesive and/or said electromechanical transducers due to external shocks being imparted to the filter.

3. An electromechanical reed filter comprising: a base member; a protective casing mounted on said base member and defining therewith a housing; a plurality of resonant metal reeds disposed within said housing, one end of said reeds being connected together and connected to said base member thereby mounting said reeds with their other end free to undergo mechanical resonance; a plurality of electromechanical transducers each adhered by adhesive to respective ones of said metal reeds; and means comprising resilient shock-absorbing members secured to said other end of said metal reeds and coacting therewith for preventing cracking of said adhesive when abnormally large external shocks are imparted to the reed filter by preventing direct collision of said metal reeds with said casing.

4. An electromechanical reed filter comprising; a base member; a protective casing mounted on said base member and defining therewith a housing; a plurality of resonant metal reeds disposed within said housing, one end of said reeds being connected together and connected to said base member thereby mounting said reeds with their other end free to undergo mechanical resonance; a plurality of electromechanical transducers each adhered by adhesive to respective ones of said metal reeds; and means coacting with said other end of said reeds for preventing cracking of said adhesive when abnormally large external shocks are imparted to the reed filter by preventing direct collision of said metal reeds with said casing, said means for preventing cracking of said adhesive including means for suppressing spurious vibrations of said metal reeds.

5. An electromechanical reed filter comprising: a base member; a protective casing mounted on said base member and defining therewith a housing; a plurality of resonant metal reeds disposed within said housing, one end of said reeds being connected together and connected to said base member thereby mounting said reeds with their other end free to undergo mechanical resonance; a plurality of electromechanical transducers each adhered by adhesive to respective ones of said metal reeds; and means coacting with said other end of said reeds for preventing cracking of said adhesive when abnormally large external shocks are imparted to the reed filter by preventing direct collision of said metal reeds with said casing, said means for preventing cracking comprising resilient shock-absorbing members secured to said other end of said metal reeds and having sufficient mass so as to prevent spurious vibrations at frequencies higher than the resonant frequency of said metal reeds.

* * * * *